(12) United States Patent
Lim et al.

(10) Patent No.: US 12,073,893 B2
(45) Date of Patent: Aug. 27, 2024

(54) SEMICONDUCTOR MEMORY DEVICE AND METHOD OF OPERATING THE SAME WHEREBY THE VOLTAGE OF A FLOATED COMMON SOURCE LINE IS INCREASED BY INCREASING THE VOLTAGE OF A SOURCE SELECT LINE COUPLED TO AN UNSELECTED MEMORY BLOCK

(71) Applicant: SK hynix Inc., Icheon-si (KR)

(72) Inventors: Kwang Min Lim, Icheon-si (KR); Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/365,718

(22) Filed: Jul. 1, 2021

(65) Prior Publication Data

US 2022/0215889 A1 Jul. 7, 2022

(30) Foreign Application Priority Data

Jan. 5, 2021 (KR) .......................... 10-2021-0001137

(51) Int. Cl.
*G11C 16/04* (2006.01)
*G11C 16/10* (2006.01)
*G11C 16/34* (2006.01)

(52) U.S. Cl.
CPC ...... *G11C 16/3427* (2013.01); *G11C 16/0483* (2013.01); *G11C 16/10* (2013.01); *G11C 16/3459* (2013.01)

(58) Field of Classification Search
CPC . G11C 16/3427; G11C 16/0483; G11C 16/10; G11C 16/3459; G11C 16/08; G11C 16/24

USPC ...................................................... 365/185.02
See application file for complete search history.

(56) References Cited

U.S. PATENT DOCUMENTS

| | | | | |
|---|---|---|---|---|
| 8,917,558 B2 * | 12/2014 | Han | ...................... | G11C 16/08 |
| | | | | 365/185.05 |
| 2019/0051355 A1 * | 2/2019 | Lee | .................... | G11C 16/3459 |
| 2019/0164609 A1 * | 5/2019 | Lee | ........................ | G11C 16/12 |
| 2019/0363099 A1 * | 11/2019 | Lee | .................... | G11C 11/5628 |

FOREIGN PATENT DOCUMENTS

| KR | 1020160137793 A | 12/2016 |
|---|---|---|
| KR | 1020190017526 A | 2/2019 |

* cited by examiner

*Primary Examiner* — Tha-O H Bui
(74) *Attorney, Agent, or Firm* — WILLIAM PARK & ASSOCIATES LTD.

(57) ABSTRACT

A semiconductor memory device, and a method of operating the same, includes a memory cell array, a peripheral circuit, and control logic. The memory cell array includes a plurality of memory blocks coupled to a common source line. The peripheral circuit performs a program operation on a memory block selected from among the memory blocks. The control logic controls the program operation of the peripheral circuit. The memory blocks are coupled to corresponding source select lines, respectively. The program operation includes a plurality of program loops, each including a channel precharge operation. During the channel precharge operation, the control logic controls the peripheral circuit so that the common source line floats and a voltage of a source select line coupled to an unselected memory block, among the memory blocks, is increased.

17 Claims, 15 Drawing Sheets

SEMICONDUCTOR MEMORY DEVICE AND METHOD OF OPERATING THE SAME WHEREBY THE VOLTAGE OF A FLOATED COMMON SOURCE LINE IS INCREASED BY INCREASING THE VOLTAGE OF A SOURCE SELECT LINE COUPLED TO AN UNSELECTED MEMORY BLOCK

CROSS-REFERENCE TO RELATED APPLICATION

The present application claims priority under 35 U.S.C. § 119(a) to Korean patent application number 10-2021-0001137, filed on Jan. 5, 2021, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

A semiconductor memory device may have a two-dimensional (2D) structure in which strings are horizontally arranged on a semiconductor substrate. Alternatively, the memory device may have a three-dimensional (3D) structure in which strings are vertically arranged over a semiconductor substrate. As memory devices having a 2D structure are reaching their physical scaling limit (i.e., limit in the degree of integration), 3D memory devices including a plurality of memory cells vertically arranged over a semiconductor substrate have been produced.

SUMMARY

Various embodiments of the present disclosure are directed to a semiconductor memory device having enhanced program characteristics and a method of operating the semiconductor memory device, An embodiment of the present disclosure is directed to a semiconductor memory device. The semiconductor memory device may include a memory cell array, a peripheral circuit, and control logic. The memory cell array may include a plurality of memory blocks coupled to a common source line. The peripheral circuit may be configured to perform a program operation on a selected memory block selected from among the plurality of memory blocks included in the memory cell array. The control logic may control the program operation of the peripheral circuit, The plurality of memory blocks may be coupled to corresponding source select lines, respectively, The program operation may include a plurality of program loops, each including a channel precharge operation. During the channel precharge operation, the control logic may control the peripheral circuit so that the common source line floats and a voltage of a source select line coupled to an unselected memory block, among the plurality of memory blocks, is increased.

In an embodiment, the control logic may be configured to control, before the common source line floats, the peripheral circuit so that a turn-on voltage is applied to a source select line coupled to the selected memory block and a voltage of the common source line is increased.

In an embodiment, the control logic may be configured to control, after the voltage of the source select line coupled to the unselected memory block has increased, the peripheral circuit so that a turn-off voltage is applied to a source select line coupled to the selected memory block.

In an embodiment, the unselected memory block may be coupled to a plurality of source select lines, The control logic may be configured to control, during the channel precharge operation, the peripheral circuit so that a voltage of a source select line disposed adjacent to the common source line, among the plurality of source select lines coupled to the unselected memory block, is increased.

In an embodiment, the control logic may be configured to control the peripheral circuit so that, while the voltage of the source select line disposed adjacent to the common source line, among the plurality of source select lines coupled to the unselected memory block, is increased, a voltage of an additional source select line that is not disposed adjacent to the common source line, among the plurality of source select lines coupled to the unselected memory block, is maintained.

An embodiment of the present disclosure is directed to a semiconductor memory device. The semiconductor memory device may include a memory cell array, a peripheral circuit, and control logic. The memory cell array may include a plurality of memory blocks coupled to a common source line. The peripheral circuit may perform a program operation on a selected memory block selected from among the plurality of memory blocks included in the memory cell array. The control logic may control the program operation of the peripheral circuit, The plurality of memory blocks are coupled to corresponding source select lines, respectively. The program operation may include a plurality of program loops, each including a channel precharge operation, a program puke application operation, and a program verify operation. During the channel precharge operation, the control logic may control the peripheral circuit so that a first voltage is applied to the common source line, the common source line floats, and a voltage of the common source line is increased from the first voltage by a coupling voltage by increasing a voltage of a source select line coupled to an unselected memory block, among the plurality of memory blocks.

In an embodiment, the control logic may be configured to control, before the first voltage is applied to the common source line, the peripheral circuit so that a turn-on voltage is applied to a source select line coupled to the selected memory block, and a ground voltage is applied to the common source line.

In an embodiment, the control logic may be configured to control, after the voltage of the common source line has increased from the first voltage by the coupling voltage, the peripheral circuit so that a turn-off voltage is applied to a source select line coupled to the selected memory block.

In an embodiment, the unselected memory block may be coupled to a first source select line that is disposed adjacent to the common source line and a second source select line that is not adjacent to the common source line. The control logic may be configured to control, during the channel precharge operation, the peripheral circuit so that a voltage of the first source select line coupled to the unselected memory block is increased.

In an embodiment, the control logic may be configured to control the peripheral circuit so that, while the voltage of the first source select line coupled to the unselected memory block is increased, a voltage of the second source select line coupled to the unselected memory block is maintained.

An embodiment of the present disclosure is directed to a method of operating a semiconductor memory device, the semiconductor memory device performing a program operation on a memory block selected from among a plurality of memory blocks coupled to a common source line. The plurality of memory blocks may be coupled to corresponding source select lines, respectively. The method may include allowing the common source line to float, and increasing a voltage of a source select line coupled to an unselected memory block, among the plurality of memory blocks.

In an embodiment, the method may further include, before allowing the common source line to float, applying a turn-on voltage to a source select line coupled to the selected memory block, and increasing a voltage of the common source line.

In an embodiment, the method may further include, after increasing the voltage of the source select line coupled to the unselected memory block, applying a turn-off voltage to a source select line coupled to the selected memory block.

In an embodiment, the method may further include, after increasing the voltage of the source select line coupled to the unselected memory block, among the plurality of memory blocks, applying a pass voltage to an unselected word line, among a plurality of word lines coupled to the selected memory block, and applying a program voltage to the selected word line.

In an embodiment, the method may further include performing a program verify operation on memory cells coupled to the selected word line.

In an embodiment, the unselected memory block may be coupled to a plurality of source select lines. Increasing the voltage of the source select line coupled to the unselected memory block, among the plurality of memory blocks may include increasing a voltage of a source select line that is disposed adjacent to the common source line, among the plurality of source select lines coupled to the unselected memory block.

In an embodiment, increasing the voltage of the source select line coupled to the unselected memory block, among the plurality of memory blocks, may further include maintaining a voltage of an additional source select line that is not disposed adjacent to the common source line, among the plurality of source select lines coupled to the unselected memory block while increasing the voltage of the source select line that is disposed adjacent to the common source line.

DETAILED DESCRIPTION

Specific structural and functional descriptions in the embodiments of the present disclosure introduced in this specification or application are exemplified to describe embodiments according to the concept of the present disclosure, The embodiments according to the concept of the present disclosure may be practiced in various forms, and should not be construed as being limited to the embodiments described in the specification or application.

Figure 1:
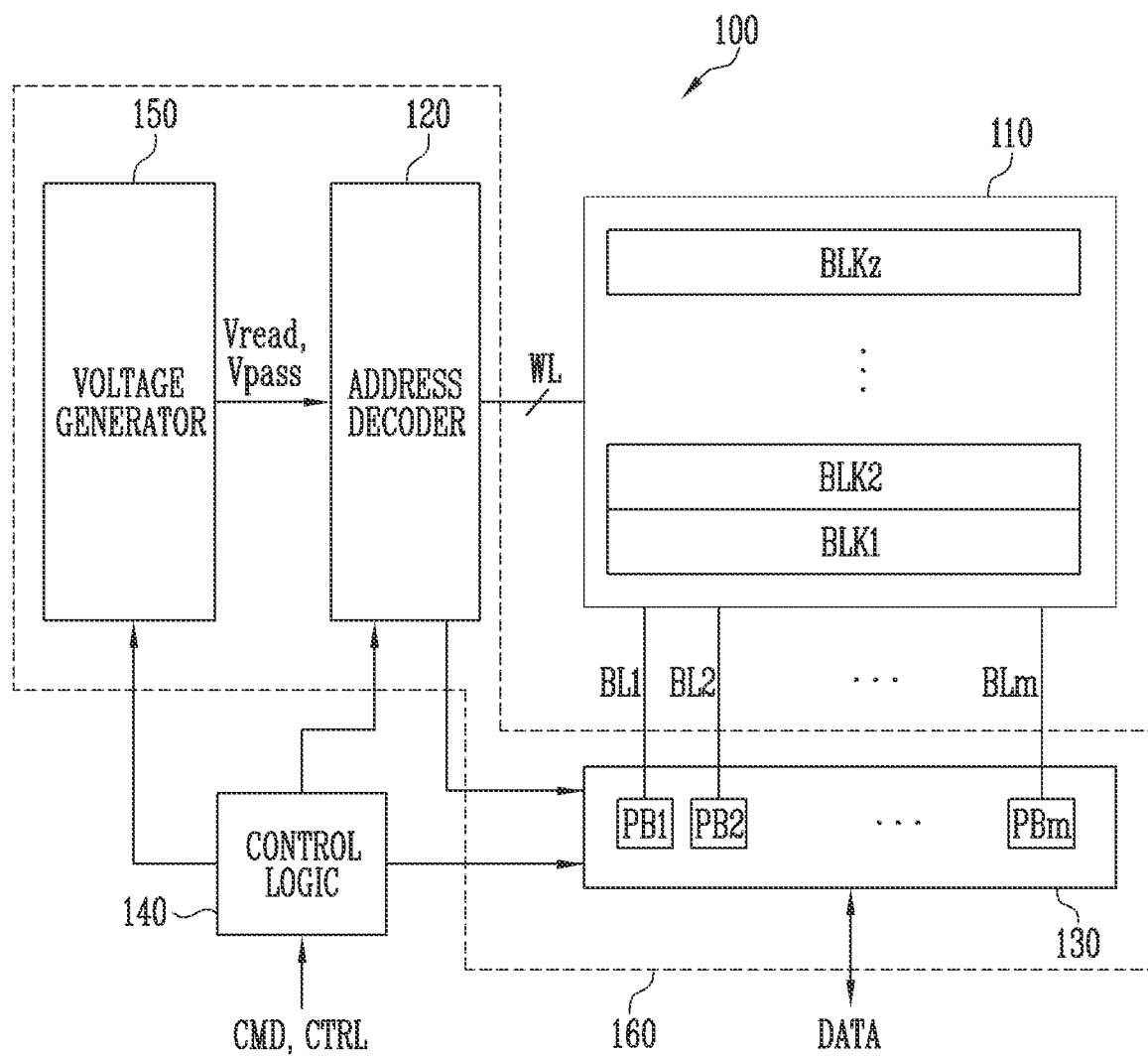
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, control logic 140, and a voltage generator 150.

The memory cell array 110 may include a plurality of memory blocks BLK1 to BLKz, The memory blocks BLK1 to BLKz may be coupled to the address decoder 120 through word lines WL. The memory blocks BLK1 to BLKz may be coupled to the read and write circuit 130 through bit lines BL1 to BLm, Each of the memory blocks BLK1 to BLKz may include a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Each of the memory cells included in the memory cell array 110 may store at least one bit of data. In an embodiment, each of the memory cells included in the memory cell array 110 may be a single-level cell (SLC), which stores one bit of data. In an embodiment, each of the memory cells included in the memory cell array 110 may be a multi-level cell (MLC), which stores two bits of data. In an embodiment, each of the memory cells included in the memory cell array 110 may be a triple-level cell (TLC), which stores three bits of data. In an embodiment, each of the memory cells included in the memory cell array 110 may be a quad-level cell (QLC), which stores four bits of data. In various embodiments, the memory cell array 110 may include a plurality of memory cells, each of which stores 5 or more bits of data.

The address decoder 120, the read and write circuit 130, and the voltage generator 150 are operated as a peripheral circuit 160 for driving the memory cell array 110. Here, the peripheral circuit 160 is operated under the control of the control logic 140. The address decoder 120 is coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address, among the received addresses. The address decoder 120 selects at least one memory block based on the decoded block address. When a read voltage application operation is performed during a read operation, the address decoder 120 may apply a read voltage Vread, generated by the voltage generator 150, to a selected word line of a selected memory block, and may apply a pass voltage Vpass to remaining unselected word lines. During a program verify operation, the address decoder 120 may apply a verify voltage, generated by the voltage generator 150, to a selected word line of a selected memory block, and may apply the pass voltage Vpass to remaining unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received at the request of read and program operations may include a block address, a row address, and a column address, The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm are coupled to the memory cell array 110 through the bit lines BL1 to BLm. During a read or program verify operation, in order to sense threshold voltages of the memory cells, the page buffers PB1 to PBm may continuously supply sensing current to the bit lines coupled to the memory cells while each of the page buffers PB1 to PBm senses, through a sensing node, a change in the amount of flowing current depending on the program state of a corresponding memory cell and latches it as sensing data, The read and write circuit 130 is operated in response to page buffer control signals output from the control logic 140, During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page registers).

The control logic 140 is coupled to the address decoder 120, the read and write circuit 130, and the voltage generator 150, The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal for controlling the precharge potential level of the sensing node of the plurality of page buffers PB1 to PBm. The control logic 140 may control the read and write circuit 130 to perform a read operation of the memory cell array 110. The control logic 140 may control the voltage generator 150 so that various voltages to be used for the program operation of the memory cell array 110 are generated. Also, the control logic 140 may control the address decoder 120 so that the voltages generated by the voltage generator 150 are transferred to local lines of a memory block that is the target of operation through global lines. Meanwhile, the control logic 140 may control the read and write circuit 130 so that, during a read operation, the read and write circuit 130 reads data from a selected page of the memory block through the bit lines BL1 to BLm and stores the read data in the page buffers PB1 to PBm. Furthermore, the control logic 140 may control the read and write circuit 130 so that, during a program operation, the read and write circuit 130 programs the data, stored in the page buffers PB1 to PBm, to a selected page. The control logic 140 may be implemented as hardware, software, or a combination of hardware and software. For example, the control logic 140 may be a control logic circuit operating in accordance with an algorithm and/or a processor executing control logic code.

The voltage generator 150 may generate a read voltage Vread and a pass voltage Vpass required for a read operation in response to the control signal output from the control logic 140. The voltage generator 150 may include a plurality of pumping capacitors for receiving an internal supply voltage to generate a plurality of voltages having various voltage levels, and may generate a plurality of voltages by selectively enabling the plurality of pumping capacitors under the control of the control logic 140.

The address decoder 120, the read and write circuit 130, and the voltage generator 150 may function as a peripheral circuit 160 which performs a read operation, a write operation, and an erase operation on the memory cell array 110. The peripheral circuit 160 may perform a read operation, a write operation, and an erase operation on the memory cell array 110 under the control of the control logic 140.

Figure 2:
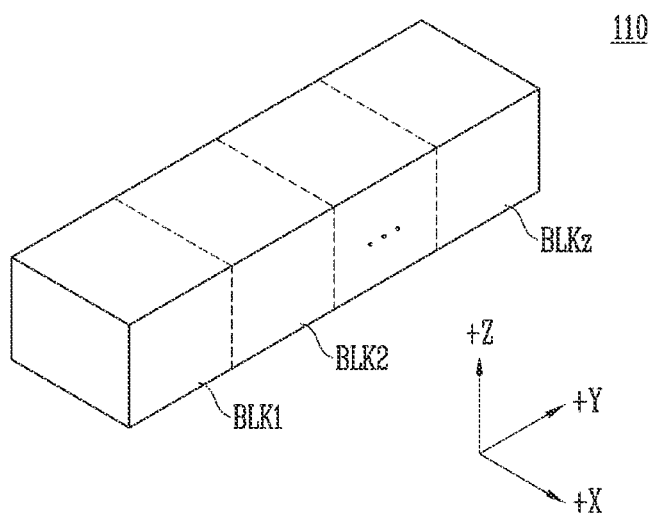
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block has a three-dimensional (3D) structure. Each of the memory blocks may to include a plurality of memory cells stacked on a substrate, The plurality of memory cells are arranged in +X, +Y, and +Z directions. The structure of each memory block will be described in more detail below with reference to FIGS. 3 and 4, FIG. 3 is a circuit diagram illustrating any one memory block BLKa of memory blocks BLK1 to BLKz of FIG. 2.

Figure 3:
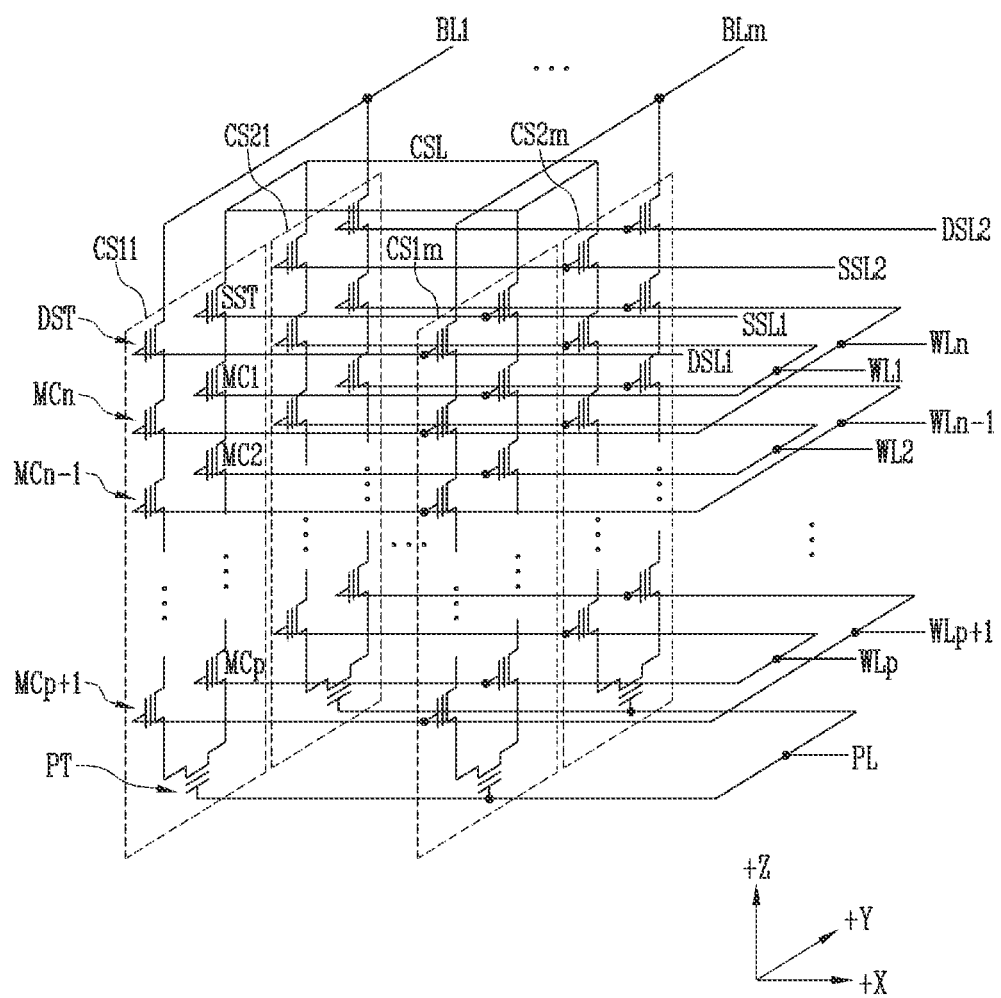
FIG. 3 is a circuit diagram illustrating any one memory block of memory blocks of FIG. 2.
Figure 4:
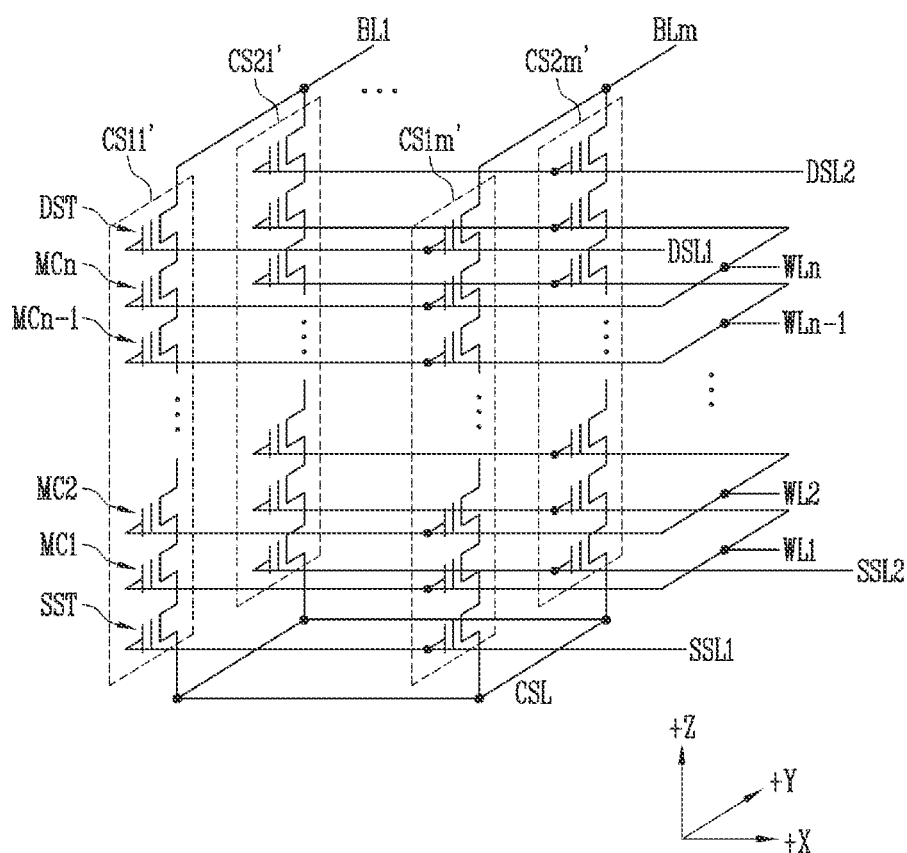
FIG. 4 is a circuit diagram illustrating an example of any one memory block of the memory blocks of FIG. 2.

Referring to FIG. 3, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., a positive (+) X direction). In FIG. 3, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string, The source select transistor SST of each cell string is coupled between the common source line CSL and the memory cells MC1 to MCp, In an embodiment, source select transistors of cell strings arranged in the same row are coupled to a source select line extending in a row direction, and source select transistors of cell strings arranged in different rows are coupled to different source select lines. In FIG. 3, source select transistors of the cell strings CS11 to CS1m in a first row are coupled to a first source select line SSL1. Source select transistors of the cell strings CS21 to CS2m in a second row are coupled to a second source select line SSL2.

In an embodiment, source select transistors of the cell strings CS11 to CS1m and CS21 to CS2m may be coupled in common to one source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to a positive (+) Z direction to and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. Gates of the first to n-th memory cells MC1 to MCn of each cell string are coupled to first to n-th word lines WU to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1, Drain select transistors of the cell strings CS21 to CS2m in the second row are coupled to a second drain select line DSL2.

Cell strings arranged in the column direction may be coupled to bit lines extending in the column direction, In FIG. 3, the cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines Dal and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines.

Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may be decreased, whereas the reliability of operation of the memory block BLKa may be deteriorated.

In order to efficiently control the one or more dummy memory cells, respective dummy memory cells may have required threshold voltages. Before or after an erase operation on the memory block BLKa is performed, program operations may be performed on all or some of the dummy memory cells. When the erase operation is performed after the program operations have been performed, the respective dummy memory cells may have required threshold voltages by controlling voltages to be applied to dummy word lines coupled to respective dummy memory cells.

FIG. 4 is a circuit diagram illustrating an example of any one memory block BLKb of the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' extends along a positive Z (+Z) direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1 The drain select transistors of the cell strings CS21' to CS2m' in the second row are coupled to a second drain select line DSL2.

As a result, the memory block BLKb of FIG. 4 has an equivalent circuit similar to that of the memory block BLKa of FIG. 3 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the dummy memory cells may have required threshold voltages by controlling the voltages to be applied to the dummy word lines coupled to respective dummy memory cells.

Figure 5:
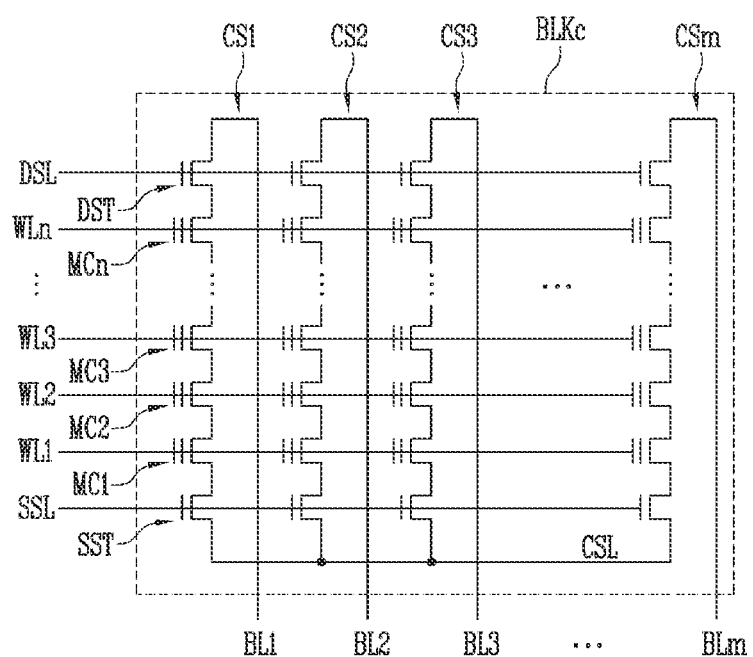
FIG. 5 is a circuit diagram illustrating an example of any one memory block of the memory blocks included in the memory cell array of FIG. 1.

FIG. 5 is a circuit diagram illustrating an example of any one memory block BLKc of the memory blocks BLK1 to BLKz included in the memory cell array 110 of FIG. 1.

Referring to FIG. 5, the memory block BLKc may include a plurality of cell strings CS1 to CSm. The plurality of cell strings CS1 to CSm may be coupled to a plurality of bit lines BL1 to BLm, respectively, Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string, In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm, Among the cell strings CS1 to CSm, even-numbered cell strings may be coupled to the even bit lines, respectively, and odd-numbered cell strings may be coupled to the odd bit lines, respectively.

As illustrated in FIGS. 2 to 4, the memory cell array 110 of the semiconductor memory device 100 may be implemented as a memory cell array having a 3D structure. Further, as illustrated in FIG. 5, the memory cell array 110 of the semiconductor memory device 100 may be implemented as a memory cell array having a 2D structure.

Figure 6:
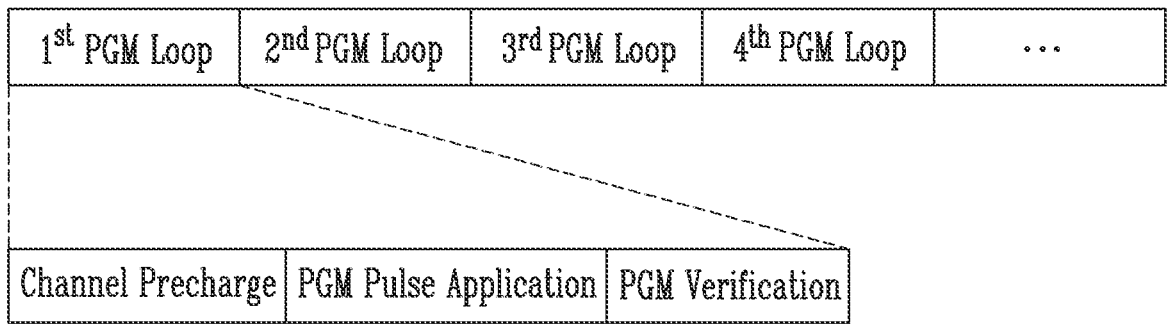
FIG. 6 is a diagram illustrating a plurality of program loops included in a program operation of a semiconductor memory device.

FIG. 6 is a diagram illustrating a plurality of program loops included in a program operation of a semiconductor memory device, Referring to FIG. 6, the program operation of the semiconductor memory device may include a plurality of program loops, As illustrated in FIG. 6, a first program loop ($1^{st}$ PGM Loop) may be performed. After the first program loop ($1^{st}$ PGM Loop) has been performed, a second program loop ($2^{nd}$ PGM Loop) may be performed unless a program operation performed on memory cells included in a selected page is completed. After the second program loop ($2^{nd}$ PGM Loop) has been performed, a third program loop ($3^{rd}$ PGM Loop) may be performed unless a program operation performed on memory cells included in the selected page is completed. In this manner, until the program operation performed on the memory cells included in the selected page is completed or until the current program loop reaches the maximum program loop, a plurality of program loops may be repeated.

Meanwhile, the program operation of the semiconductor memory device may be performed using an incremental step pulse programming (ISPP) scheme. The ISPP scheme may be a scheme for programming memory cells while gradually increasing a program voltage. As the number of program loops that are performed is iterated, the program voltage applied in each program loop may gradually increase.

Meanwhile, as illustrated in FIG. 6, each of the plurality of program loops may include a channel precharge step, a program pulse application step, and a program verify step. At the channel precharge step, channel voltages of cell strings included in a memory block selected as a target of the program operation may be precharged. In detail, in order to increase the channel potential level of a cell string including a program-inhibited cell (or a program-inhibition cell), the channel voltage may be precharged in advance. In relation to the increase in the channel potential of the cell string including the program-inhibited cell, a description will be made later with reference to FIG. 7.

At the program pulse application step, threshold voltages of program-permitted cells (or program-permission cells) may be increased by applying a program voltage to a selected word line. The program pulse application step will be described in detail later with reference to FIG. 11.

At the program verify step, whether memory cells selected as the program target have been programmed to a voltage at a desired level (hereinafter referred to as a 'reference voltage') or more may be verified, As a result of the verify operation, a memory cell which is not programmed to the reference voltage or more may be operated as a program-permitted cell in a subsequent program loop. Here, a program pulse having a voltage level higher than that in a previous program loop may be applied to the program-permitted cell, Meanwhile, a memory cell which is programmed to the reference voltage or more may be operated as a program-inhibited cell in a subsequent program loop. Even if the program pulse is applied to the selected word line, the threshold voltage of the program-inhibited cell does not increase.

Figure 7:
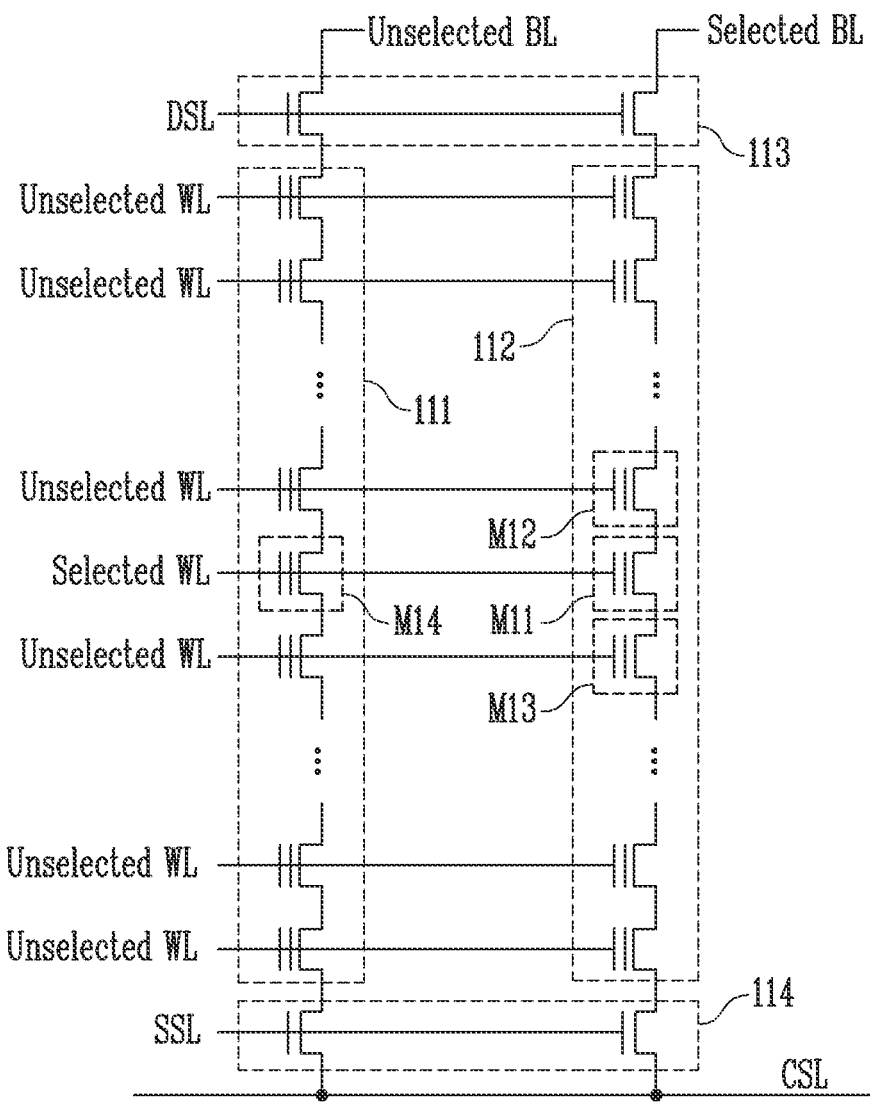
FIG. 7 is a circuit diagram illustrating a program operation performed on a selected memory block.

FIG. 7 is a circuit diagram illustrating a program operation performed on a selected memory block. In FIG. 7, only some cell strings 111 and 112, among a plurality of cell strings included in the selected memory block, are illustrated. In an example of FIG. 7, the cell string 111 includes a program-inhibited cell M14, and the cell string 112 includes a program-permitted cell Mil. The semiconductor memory device 100 may include a plurality of memory blocks, and a memory block that is the target of a program operation, among the plurality of memory blocks, may include the cell strings 111 and 112 in which a plurality of memory cells for storing data are coupled in series, drain select transistors 113 which are coupled between the cell strings 111 and 112 and bit lines, and source select transistors 114 which are coupled between the cell strings 111 and 112 and a common source line CSL, as illustrated in FIG. 7. Here, the number of cell strings 111 and 112 that are configured may be identical to the number of bit lines, and thus the numbers of drain select transistors 113 and source select transistors 114 that are configured are also identical to the number of bit lines. Also, in order to perform a predetermined operation on the memory cells, a predetermined bias may be applied to the gates of the memory cells through word lines WL, a predetermined bias may be applied to a drain of the drain select transistor 113 through the bit lines BL, and a predetermined bias may be applied to a source of the source select transistor 114 through the common source line CSL.

A program operation or an erase operation is performed by injecting or emitting electrons into or from a floating gate of each memory cell, included in a semiconductor memory device according to an embodiment of the present disclosure, using Fowler-Nordheim (FN) tunneling, wherein the erase operation is performed on a block basis and the program operation is performed on a selected cell.

Each selected page in the semiconductor memory device may include a plurality of memory cells. Among the plurality of memory cells included in each selected page, program-permitted cells may denote memory cells, threshold voltages of which have not yet increased to a target voltage. When a program voltage is applied to a selected word line, the threshold voltages of the program-permitted cells may increase, Among the plurality of memory cells included in each selected page, program-inhibited cells may denote memory cells, threshold voltages of which have increased up to the target voltage. When the program voltage is applied to the selected word line, the threshold voltages of the program-inhibited cells does not increase.

In an example of FIG. 7, the memory cell M11 is a program-permitted cell, and the memory cell M14 may be a program-inhibited cell. Meanwhile, memory cells M12 and M13 coupled to unselected word lines may he unselected memory cells. In order to program the program-permitted cell M11 included in the selected page, a program voltage of about 18 V may be applied to a selected word line Selected WL, a pass voltage of about 8 V may be applied to unselected word lines Unselected WL, a ground voltage VSS may be applied to a selected bit line Selected BL, and a power supply voltage VCC may be applied to an unselected bit line Unselected BL. Here, the power supply voltage VCC may be applied to a drain select line DSL, the ground voltage VSS may be applied to a source select line SSL, and the power supply voltage VCC may be applied to the common source line CSL.

By means of this scheme, the program voltage is applied to a control gate of the program-inhibited cell M14, but, in the cell string 111 including the program-inhibited cell M14, the potential of a channel may be increased at a voltage ratio caused by coupling between the program voltage, the pass voltage, and the precharge voltage from the bit line. Owing to the channel potential increased in this way, program disturbance may be mitigated or prevented by blocking FN tunneling of the program-inhibited cell M14 in the cell string 111 coupled to the unselected bit line Unselected BL. Meanwhile, the case where a memory cell to which the pass voltage is applied is programmed, among memory cells included in the cell string 112 coupled to the selected bit line Selected BL, occurs, and this case is referred to as 'pass disturbance'.

In the semiconductor memory device 100, program disturbance characteristics may be an important factor that influences the performance of products. In order to mitigate or prevent program disturbance of the program-inhibited cell M14, the channel potential level of the cell string 111 coupled to the unselected bit line Unselected BL should be sufficiently secured. That is, the channel potential of the cell string 111 coupled to the unselected bit line Unselected BL should be sufficiently high when the channel potential is increased. For this operation, at the channel precharge step such as that illustrated in FIG. 6, the channel potential may be increased in advance. Meanwhile, because a capacitance value between the common source line CSL and the source select line SSL is large, a problem may arise in that the channel potential level is not sufficiently increased. This may be the cause of deteriorating program disturbance because a channel length is increased as the number of memory cells included in the cell string becomes larger.

In accordance with an embodiment of the present disclosure, the channel voltages of cell strings in the selected memory block may be increased by increasing the voltage of a source select line coupled to an unselected memory block. Accordingly, the channel voltage of the cell string 111 coupled to the unselected bit line Unselected BL may become sufficiently high when the channel potential is increased. As a result, during a program operation, program disturbance of the program-inhibited cell M14 may be effectively mitigated or prevented.

Figure 8:
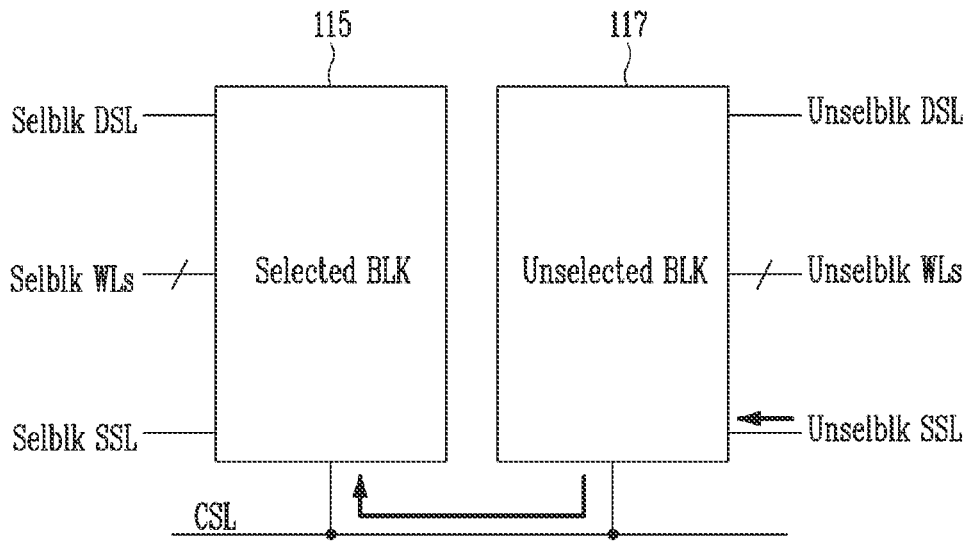
FIG. 8 is a diagram for describing an increase in channel potential caused by an unselected memory block.

FIG. 8 is a diagram illustrating an increase in channel potential caused by an unselected memory block.

Referring to FIG. 8, a selected memory block Selected BLK 115 and an unselected memory block Unselected BLK 117 are depicted. The selected memory block 115 may be a memory block that is the target of a program operation, and may be a memory block including memory cells to be programmed. Meanwhile, the unselected memory block 117 may be a memory block that is not the target of the program operation. The selected memory block 115 may be coupled to a selected block drain select line Selblk DSL, selected block word lines Selblk WLs, and an unselected block source select line Selblk SSL. Meanwhile, the selected memory block 115 may be coupled to a common source line CSL. Further, the unselected memory block 117 may be coupled to an unselected block drain select line Unselblk DSL, unselected block word lines Unselblk WLs, and an unselected block source select line Unselblk SSL. Meanwhile, the unselected memory block 117 may be coupled to the common source line CSL.

Both the selected memory block 115 and the unselected memory block 117 may be coupled to the common source line CSL. In accordance with the semiconductor memory device and a method of operating the semiconductor memory device according to an embodiment of the present disclosure, the voltage of the source select line coupled to the unselected memory block 117, that is, the unselected block source select line Unselblk SSL is increased. In this case, the common source line CSL may float. Accordingly, the voltage of the common source line CSL is increased due to coupling. As the voltage of the common source line CSL is increased, the channel voltages of cell strings included in the selected memory block 115 may be increased. Accordingly, the channel voltage of a cell string including a program-inhibited cell, included in the selected memory block 115, may be sufficiently increased. Consequently, when a channel potential is increased, the channel voltage of the cell string including the program-inhibited cell may also become sufficiently high. As a result, during a program operation, program disturbance of the program-inhibited cell M14 may be effectively mitigated or prevented. Below, a description will be made in detail with reference to FIG. 9.

Figure 9:
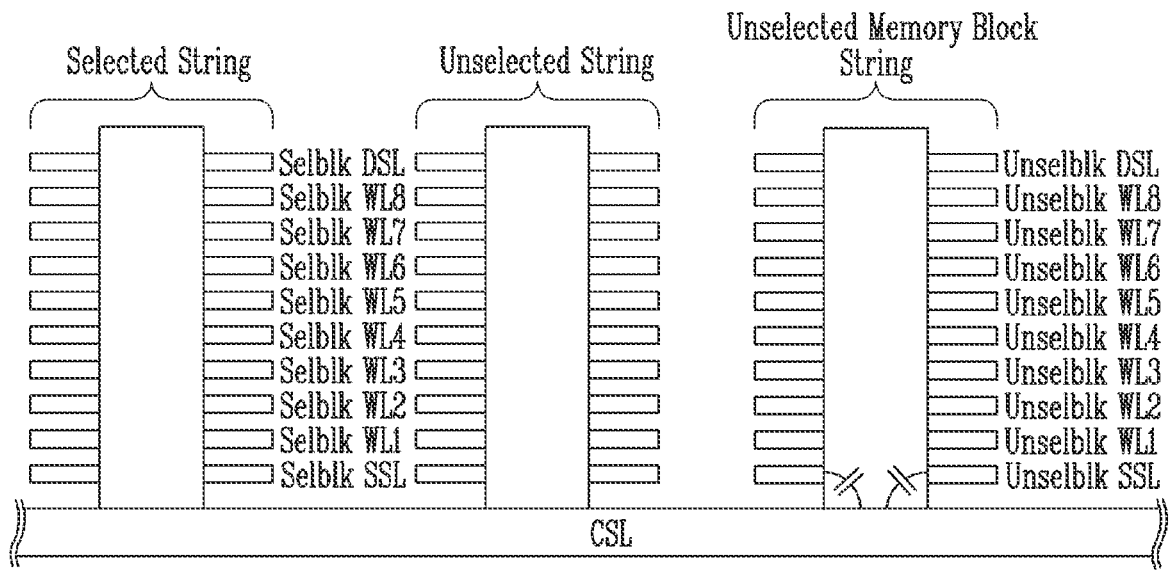
FIG. 9 is a diagram for describing an increase in channel potential through a source select line coupled to an unselected memory block in an example of a string structure.

FIG. 9 is a diagram for describing an increase in channel potential through a source select line coupled to an unselected memory block in an example of a string structure.

Referring to FIG. 9, a selected string (Selected String), an unselected string (Unselected String), and an unselected memory block string (Unselected Memory Block String) are formed on a common source line CSL. In detail, pillars on which respective channels of the selected string (Selected String) and the unselected string (Unselected String) are to be configured are formed on the common source line CSL, and selected block source select lines Selblk SSL, selected block word lines Selblk WL1 to Selblk WL8, and selected block drain select lines Selblk DSL are formed around the pillars, Further, a pillar on which a channel of the unselected memory block string (Unselected Memory Block String) is to be configured is formed on the common source line CSL, and an unselected block source select line Unselblk SSL, unselected block word lines Unselblk WL1 to Unselblk WL8, and an unselected block drain select line Unselblk DSL are formed around the pillar.

The selected string (Selected String) and the unselected string (Unselected String), illustrated in FIG. 9, may be cell strings included in the selected memory block 115 illustrated in FIG. 8. Although the selected memory block 115 may include a plurality of selected strings and a plurality of unselected strings, only one selected string and one unselected string are illustrated in FIG. 9 as an example.

Meanwhile, the unselected memory block string (Unselected Memory Block String) illustrated in FIG. 9 may be any one of a plurality of cell strings included in the unselected memory block 117 illustrated in FIG. 8. Although the unselected memory block 117 may include a plurality of cell strings, only one cell string included in the unselected memory block is illustrated in FIG. 9 as an example.

In FIG. 9, the illustration of a charge trap layer, a channel layer, and an insulating layer formed therebetween is omitted, Meanwhile, in FIG. 9, an embodiment in which each cell string is coupled to eight word lines is illustrated, That is, each cell string illustrated in FIG. 9 may include eight memory cells. However, it can be seen that embodiments of the present disclosure are not limited thereto, and cell strings including a variety of numbers of memory cells may be implemented, Referring to FIG. 9, it can be seen that the selected string (Selected String), the unselected string (Unselected String), and the unselected memory block string (Unselected Memory Block String) are coupled to one common source line CSL. Meanwhile, the precharge voltage level of the common source line CSL may be increased using capacitance between the unselected block source select line Unselblk SSL, disposed adjacent to the common source line CSL, and the common source line CSL. That is, when the voltage of the unselected block source select line Unselblk SSL is increased in the state in which the common source line CSL floats, the voltage of the common source line CSL may also be increased, In accordance with an embodiment of the present disclosure, the channel voltages of cell strings in the selected memory block may be increased by increasing the voltage of a source select line coupled to an unselected memory block. Accordingly, the channel voltage of the cell string 111 coupled to the unselected bit line Unselected BL may become sufficiently high when the channel potential is increased. As a result, during a program operation, program disturbance of the program-inhibited cell M14 may be effectively mitigated or prevented.

Figure 10:
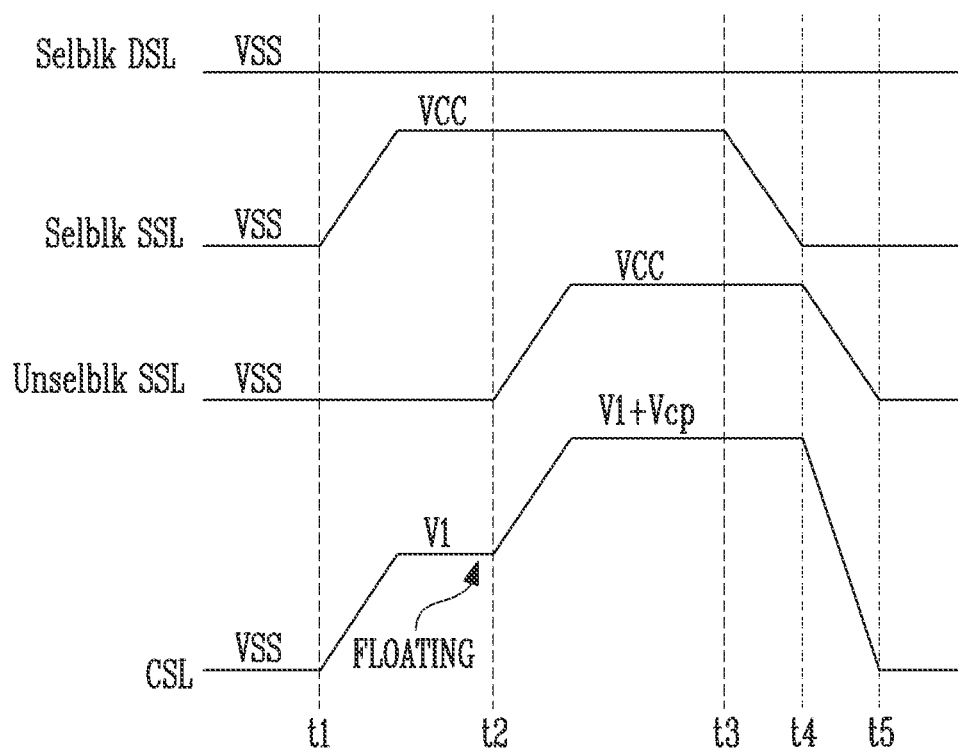
FIG. 10 is a timing diagram for describing an embodiment of a channel precharge step illustrated in FIG. 6.

FIG. 10 is a timing diagram for describing an embodiment of the channel precharge step illustrated in FIG. 6.

Referring to FIG. 10, a timing diagram of voltages of a selected block drain select line Selblk DSL, a selected block source select line Selblk SSL, an unselected block source select line Unselblk SSL, and a common source line CSL at the channel precharge step is illustrated. Before time t1, the voltages of the selected block drain select line Selblk DSL, the selected block source select line Selblk SSL, the unselected block source select line Unselblk SSL, and the common source line CSL may be a ground voltage VSS, However, this is only exemplary, and an arbitrary voltage may be applied to the selected block drain select line Selblk DSL, the selected block source select line Selblk SSL, the unselected block source select line Unselblk SSL, and the common source line CSL.

At time t1, the voltage of the selected block source select line Selblk SSL may be increased from the ground voltage VSS to a power supply voltage VCC. Accordingly, source select transistors included in the selected memory block Selected BLK may be turned on. Therefore, the voltage of the common source line CSL may be transferred to the channels of the strings included in the selected memory block Selected BLK.

Meanwhile, at time t1, the voltage of the common source line CSL may be increased from the ground voltage VSS to a first voltage V1. The first voltage V1 may be a voltage directly applied from the voltage generator 150 to the common source line CSL. After the voltage of the common source line CSL has been increased to the first voltage V1, the common source line CSL may float. As the common source line CSL floats, the voltage of the common source line CSL may be maintained at the first voltage V1.

Thereafter, at time t2, the voltage of the unselected block source select line Unselblk SSL may be increased from the ground voltage VSS to a power supply voltage VCC. Accordingly, the voltage of the common source line CSL may be increased from the first voltage V1 by a coupling voltage Vcp due to coupling. As the voltage of the common source line CSL is increased, the channel voltages of strings included in the selected memory block Selected BLK may also be further increased.

Thereafter, at time t3, the voltage of the selected block source select line Selblk SSL may be decreased from the power supply voltage VCC to the ground voltage VSS. Accordingly, source select transistors included in the selected memory block Selected BLK may be turned off. Therefore, the channels of the strings included in the selected memory block Selected BLK may be electrically isolated from the common source line CSL.

Thereafter, at time t4, the voltage of the common source line CSL and the voltage of the unselected block source select line Unselblk SSL may be decreased to the ground voltage VSS. Accordingly, at time t5, the channel precharge step may be terminated.

As illustrated in FIG. 10, during the channel precharge step, the voltage of the selected block drain select line Selblk DSL may be maintained at the ground voltage VSS. In this case, during the channel precharge step, the channels of the strings included in the selected memory block Selected BLK may be isolated from the bit lines.

Figure 11:
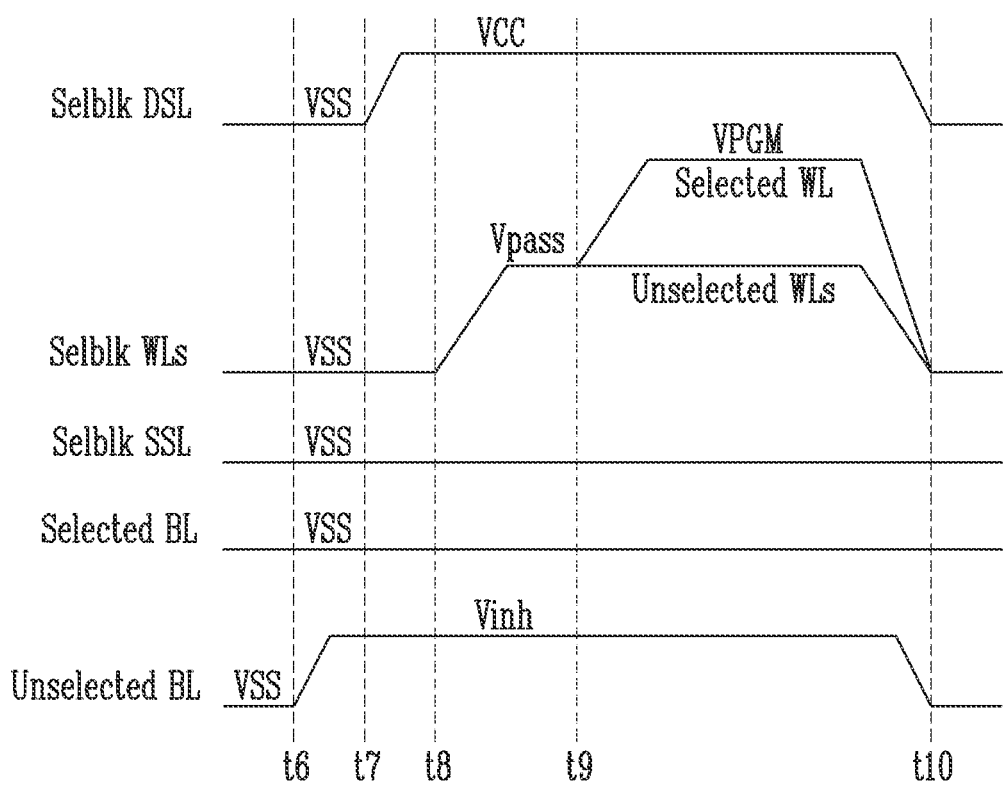
FIG. 11 is a timing diagram for describing an embodiment of a program puke application step illustrated in FIG. 6.

FIG. 11 is a timing diagram for describing an embodiment of the program pulse application step illustrated in FIG. 6.

Referring to FIG. 11, at time t6, a program-permission voltage, for example, a ground voltage VSS, may be applied to a selected bit line Selected BL coupled to a selected string including a program-permitted cell, and a program-inhibition voltage Vinh may be applied to an unselected bit line Unselected BL coupled to an unselected string including a program-inhibited cell. Here, the program-inhibition voltage Vinh may be a voltage greater than the program-permission voltage, that is, the ground voltage VSS.

At time t7, the power supply voltage VCC may be applied to the selected block drain select line Selblk DSL, Accordingly, respective cell strings included in the selected memory block may be electrically coupled to corresponding bit lines. Meanwhile, the ground voltage VSS may be applied to the selected block source select line Selblk SSL.

At time t8, a pass voltage Vpass is applied to the selected block word lines Selblk WLs. Meanwhile, at time t9, the voltage of a selected word line Selected WL, among the selected block word lines Selblk WLs, is increased from the pass voltage Vpass to a program voltage VPGM. The voltages of unselected word lines Unselected WL, among the selected block word lines Selblk WLs, are maintained at the pass voltage Vpass.

Accordingly, among memory cells coupled to the selected word line Selected WL, program-permitted cells coupled to the selected bit line Selected BL, to which the program-permission voltage, that is, the ground voltage VSS, is applied, are programmed. Meanwhile, a channel potential of a cell string coupled to the unselected bit line Unselected BL, to which the program-inhibition voltage Vinh is applied, among the memory cells coupled to the selected word line Selected WL, is increased from the voltage increased through the procedure of FIG. 10, that is, a voltage of "V1+Vcp", to a potential higher than that voltage. Accordingly, the program-inhibited cells are not programmed.

Thereafter, at time t10, the voltages of the selected block drain select line Selblk DSL, the selected block word lines Selblk WLs, and the unselected bit line Unselected BL may be decreased to the ground voltage VSS. Accordingly, at time t10, the program pulse application step may be terminated.

Meanwhile, a detailed timing diagram of the program verification illustrated in FIG. 6 will be omitted here.

Figure 12:
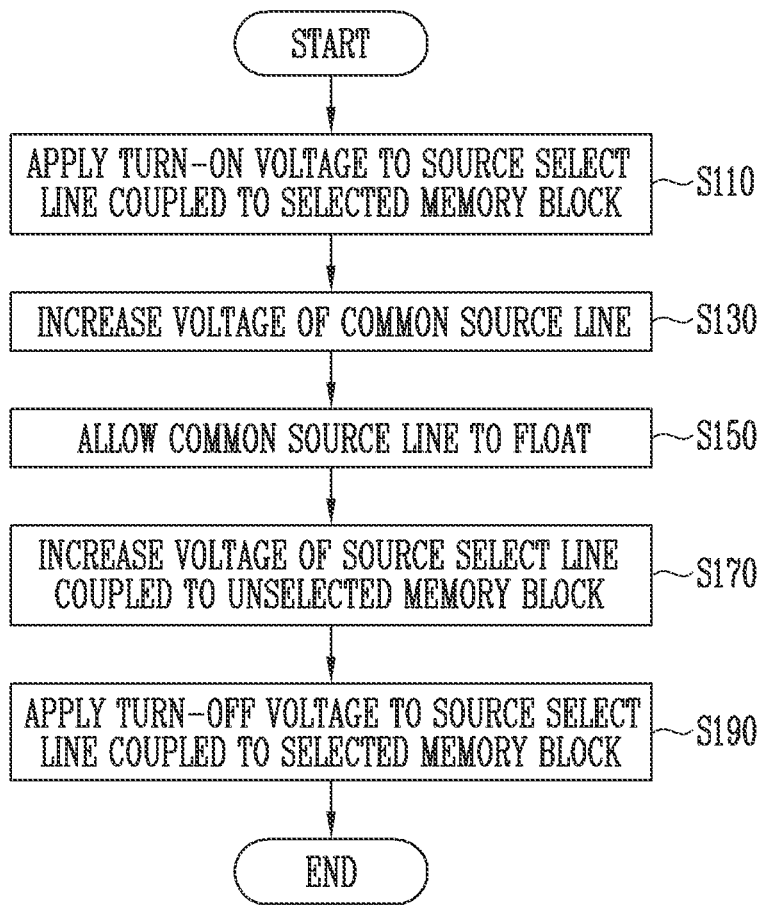
FIG. 12 is a flowchart illustrating a method of operating a semiconductor memory device according to an embodiment of the present disclosure.

FIG. 12 is a flowchart illustrating a method of operating a semiconductor memory device according to an embodiment of the present disclosure. In detail, FIG. 12 is a flowchart illustrating an embodiment of the channel precharge step illustrated in FIG. 6. Hereinafter, a description will be made with reference to FIGS. 10 and 12 together.

Referring to FIG. 12, a turn-on voltage may be applied to a source select line coupled to a selected memory block at step S110. At time t1 of FIG. 10, a power supply voltage VCC is applied to a selected block source select line Selblk SSL. At step S110, source select transistors included in the selected memory block are turned on.

Thereafter, at step S130, the voltage of a common source line may be increased. At time t1 of FIG. 10, the voltage of the common source line CSL is increased from the ground voltage VSS to a first voltage V1. Accordingly, the channel voltages of cell strings included in the selected memory block may be primarily increased. In an embodiment, the first voltage V1 may be the power supply voltage VCC.

Thereafter, at step S150, the common source line CSL may float. As illustrated in FIG. 10, a time point at which the common source line CSL floats may be an arbitrary time point between a time point at which the voltage of the common source line CSL is increased to the first voltage and a time point t2 at which the voltage of the unselected block source select line Unselblk SSL is increased.

Thereafter, at step S170, the voltage of the source select line coupled to the unselected memory block may be increased. At time t2 of FIG. 10, the voltage of the unselected block source select line Unselblk SSL may be increased from the ground voltage VSS to the power supply voltage VCC. As step S170 is performed, the voltage of the common source line CSL is increased from the first voltage V1 by a coupling voltage Vcp. As a result, the channel voltages of cell strings included in the selected memory block may be secondarily increased.

Thereafter, at step S190, a turn-off voltage may be applied to the source select line coupled to the selected memory block. At time t3 of FIG. 10, the voltage of the selected block source select line Selblk SSL may be decreased from the power supply voltage VCC to the ground voltage VSS. Accordingly, source select transistors included in the selected memory block are turned off. Therefore, the channels of the cell strings included in the selected memory block may float.

By means of the method of operating the semiconductor memory device according to the embodiment of the present disclosure, described with reference to FIG. 12, channel voltages of strings included in the memory block selected at the channel precharge step during the program operation may be sufficiently increased. Therefore, at the subsequent program voltage apply step, the channel potentials of the cell strings including the program-inhibited cells may be sufficiently increased. As a result, during the program operation, program disturbance of the program-inhibited cell M14 may be effectively mitigated or prevented.

Figure 13:
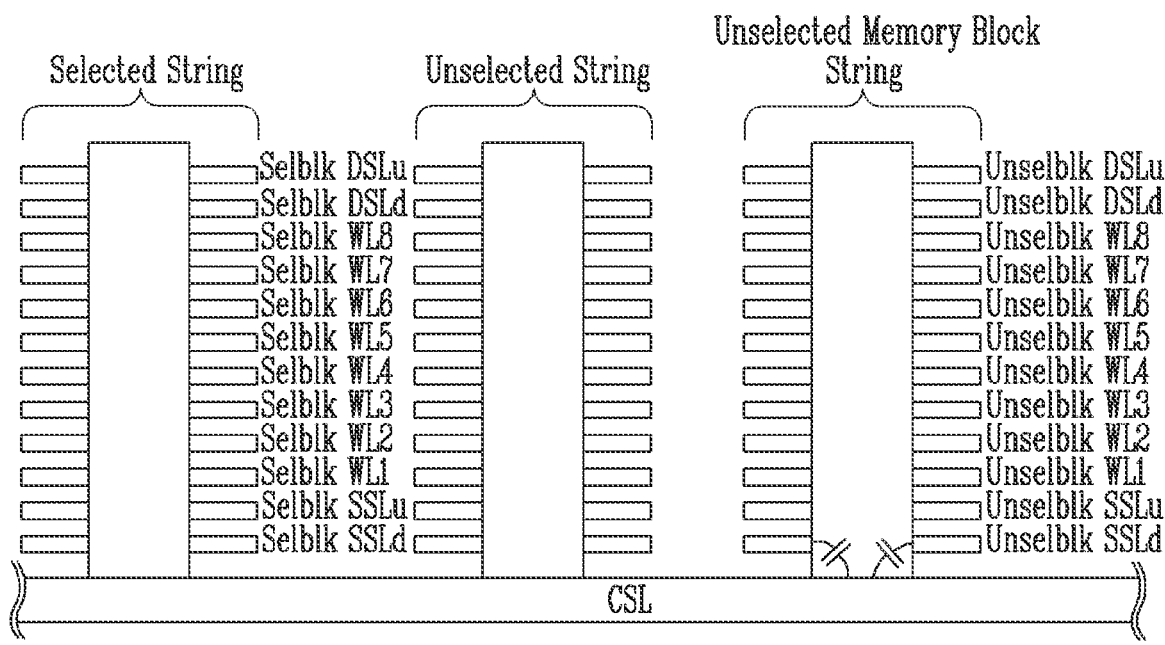
FIG. 13 is a diagram for describing an increase in channel potential through a source select line coupled to an unselected memory block in an example of the string structure.

FIG. 13 is a diagram for describing an increase in channel potential through a source select line coupled to an unselected memory block in an example of the string structure.

Referring to FIG. 13, a selected string (Selected String), an unselected string (Unselected String), and an unselected memory block string (Unselected Memory Block String) are formed on a common source line CSL. In detail, pillars on which respective channels of the selected string (Selected String) and the unselected string (Unselected String) are to be configured are formed on the common source line CSL. A selected block lower source select line Selblk SSLd, a selected block upper source select line Selblk SSLu, selected block word lines Selblk WL1 to Selblk WLB, a selected block lower drain select line Selblk DSLd, and a selected block upper drain select line Selblk DSLu are formed around the pillars. Further, pillars on which channels of the unselected memory block string (Unselected Memory Block String) are to be configured are formed on the common source line CSL. An unselected block lower source select line Unselblk SSLd, an unselected block upper source select line Unselblk SSLu, unselected block word lines Unselblk WL1 to Unselblk WL8, an unselected block lower drain select line Unselblk DSLd, and an unselected block upper drain select line Unselblk DSLu are formed around the pillars. That is, in the cell string structure illustrated in FIG. 13, two source select lines and two drain select lines may be coupled to each of the cell strings.

Referring to FIG. 13, it can be seen that the selected string (Selected String), the unselected string (Unselected String), and the unselected memory block string (Unselected Memory Block String) are coupled to one common source line CSL. Meanwhile, the precharge voltage level of the common source line may be increased using capacitance between the unselected block lower source select line Unselblk SSLd, which is disposed adjacent to the common source line CSL, of the unselected block lower and upper source select lines Unselblk SSLd and Unselblk SSLu, and the common source line. That is, when the voltage of the unselected block lower source select line Unselblk SSLd is increased in the state in which the common source line CSL floats, the voltage of the common source line CSL may also be increased. In accordance with an embodiment of the present disclosure, the channel voltages of cell strings in the selected memory block may be increased by increasing the voltage of a source select line coupled to an unselected memory block. Accordingly, the channel voltage of the cell string 111 coupled to the unselected bit line Unselected BL may become sufficiently high when the channel potential is increased. As a result, during the program operation, program disturbance of the program-inhibited cell M14 may be effectively mitigated or prevented.

Figure 14:
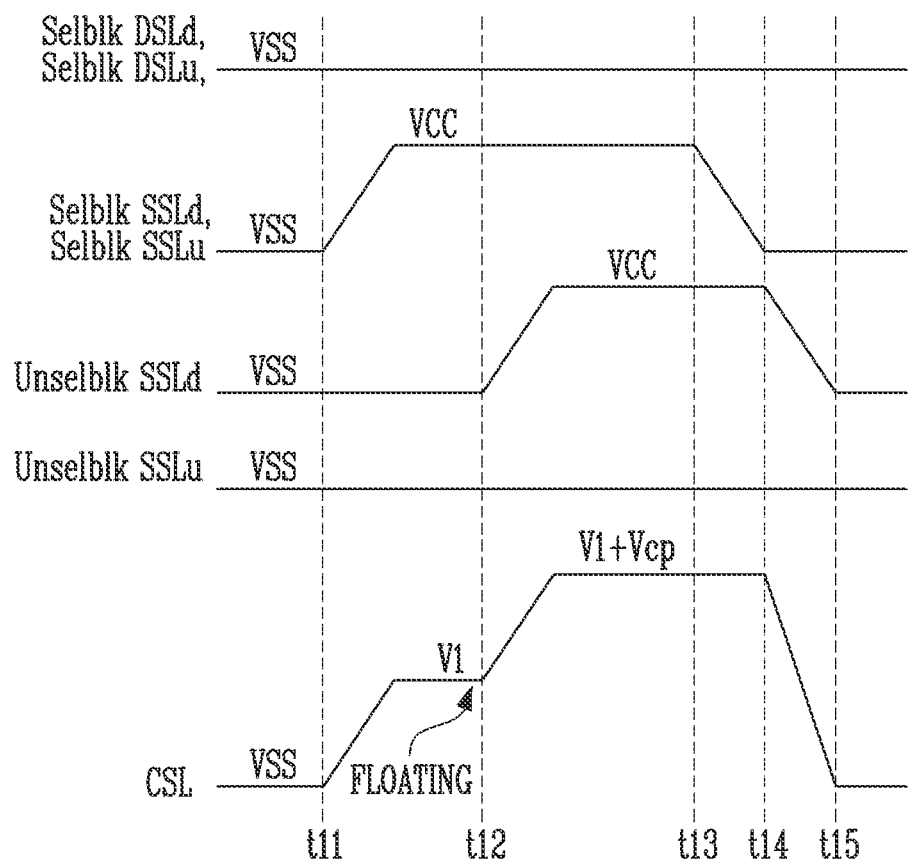
FIG. 14 is a timing diagram for describing an embodiment of the channel precharge step illustrated in FIG. 6.

FIG. 14 is a timing diagram for describing an embodiment of the channel precharge step illustrated in FIG. 6.

Referring to FIG. 14, a timing diagram of the voltages of a selected block lower drain select line Selblk DSLd, a selected block upper drain select line Selblk DSLu, a selected block lower source select line Selblk SSLd, a selected block upper source select line Selblk SSLu, an unselected block lower source select line Unselblk SSLd, an unselected block upper source select line Unselblk SSLu, and a common source line CSL at the channel precharge step is illustrated. Before time t11, the voltages of the selected block lower and upper drain select lines Selblk DSLd and Selblk DSLu, the selected block lower and upper source select lines Selblk Sad and Selblk SSLu, the unselected block lower and upper source select lines Unselblk SSLd and Unselbk SSLu, and the common source line CSL may be the ground voltage VSS.

At time t11, the voltages of the selected block lower and upper source select lines Selblk SSLd and Selblk SSLu may be increased from the ground voltage VSS to the power supply voltage VCC. Accordingly, source select transistors included in the selected memory block Selected BLK may be turned on. Therefore, the voltage of the common source line CSL may be transferred to the channels of the strings included in the selected memory block Selected BLK.

Meanwhile, at time t11, the voltage of the common source line CSL may be increased from the ground voltage VSS to a first voltage V1. The first voltage V1 may be a voltage directly applied from the voltage generator 150 to the common source line CSL. After the voltage of the common source line CSL has been increased to the first voltage V1, the common source line CSL may float, As the common source line CSL floats, the voltage of the common source line CSL may be maintained at the first voltage V1.

After, at time t12, the voltage of the unselected block lower source select line Unselblk SSLd may be increased from the ground voltage VSS to the power supply voltage VCC. Accordingly, the voltage of the common source line CSL may be increased from the first voltage V1 by a coupling voltage Vcp due to coupling. As the voltage of the common source line CSL is increased, the channel voltages of strings included in the selected memory block Selected BLK may also be further increased.

Thereafter, at time t13, the voltages of the selected block lower and upper source select lines Selblk SSLd and Selblk SSLu may be decreased from the power supply voltage VCC to the ground voltage VSS. Accordingly, source select transistors included in the selected memory block Selected BLK may be turned off, Therefore, the channels of the strings included in the selected memory block Selected BLK may be electrically isolated from the common source line CSL.

Thereafter, at time t14, the voltage of the common source line CSL and the voltage of the unselected block lower source select line Unselblk SSLd may be decreased to the ground voltage VSS. Accordingly, at time t15, the channel precharge step may be terminated.

As illustrated in FIG. 14, during the channel precharge step, the voltages of the selected block lower and upper drain select lines Selblk DSLd and Selblk DSLu may be maintained at the ground voltage VSS. In this case, during the channel precharge step, the channels of the strings included in the selected memory block Selected BLK may be isolated from the bit lines, FIG. 15 is a flowchart illustrating a method of operating a semiconductor memory device according to an embodiment of the present disclosure.

Figure 15:
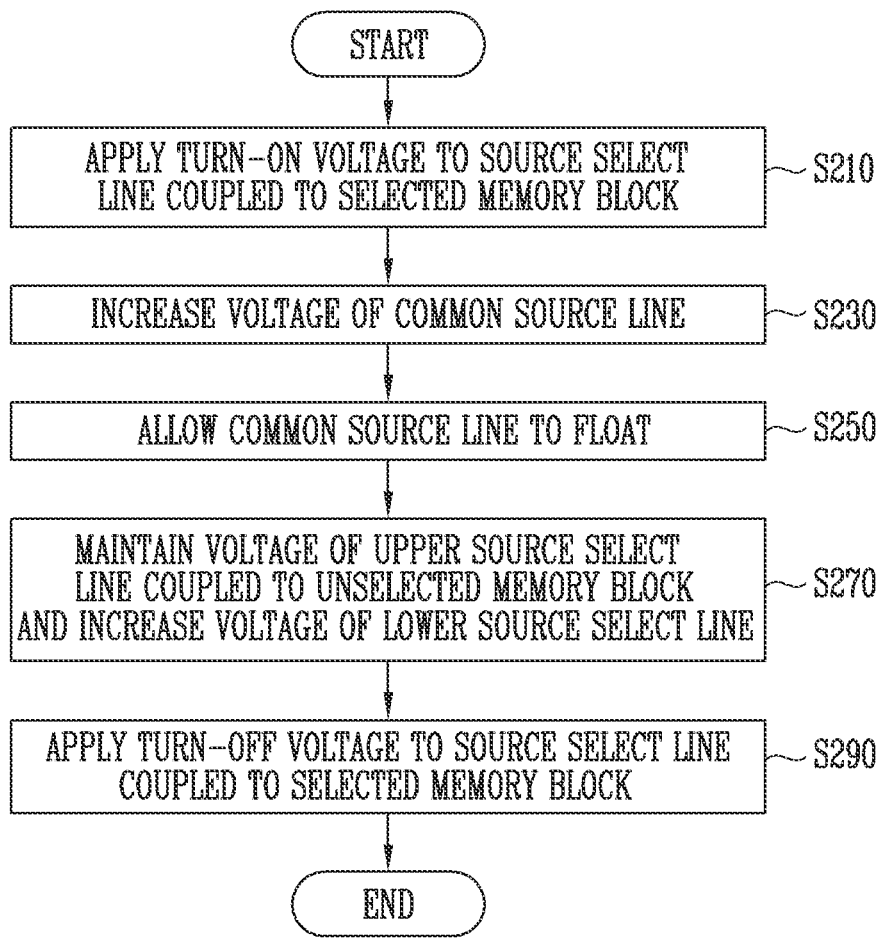
FIG. 15 is a flowchart illustrating a method of operating a semiconductor memory device according to an embodiment of the present disclosure.

In detail, FIG. 15 is a flowchart illustrating an embodiment of the channel precharge step illustrated in FIG. 6. Hereinafter, a description will be made with reference to FIGS. 14 and 15 together.

Referring to FIG. 15, a turn-on voltage may be applied to a source select line coupled to a selected memory block at step S210. At time t11 of FIG. 14, the power supply voltage VCC may be applied to selected block lower and upper source select lines Selblk SSLd and Selblk SSLu. At step S210, source select transistors included in the selected memory block are turned on.

Thereafter, at step S230, the voltage of the common source line may be increased. At time t11 of FIG. 14, the voltage of the common source line CSL is increased from the ground voltage VSS to a first voltage V1. Accordingly, the channel voltages of cell strings included in the selected memory block may be primarily increased. In an embodiment, the first voltage V1 may be the power supply voltage VCC.

Thereafter, at step S250, the common source line CSL may float. As illustrated in FIG. 14, a time point at which the common source line CSL floats may be an arbitrary time point between a time point at which the voltage of the common source line CSL is increased to the first voltage and the time point t12 at which the voltage of the unselected block lower source select line Unselblk SSLd is increased.

Thereafter, at step S270, the voltage of the upper source select line coupled to the unselected memory block may be maintained, and the voltage of the lower source select line may be increased. At time t12 of FIG. 14, the voltage of the unselected block upper source select line Unselblk SSLu is maintained at the ground voltage VSS, and the voltage of the unselected block lower source select line Unselblk SSLd is increased from the ground voltage VSS to the power supply voltage VCC. As step S270 is performed, the voltage of the common source line CSL may be increased from the first voltage V1 by a coupling voltage Vcp. As a result, the channel voltages of the cell strings included in the selected memory block may be secondarily increased.

Thereafter, at step S290, a turn-off voltage may be applied to the source select line coupled to the selected memory block. At time t14 of FIG. 10, the voltages of the selected block lower and upper source select lines Selblk Sad and Selblk SSW may be decreased from the power supply voltage VCC to the ground voltage VSS. Accordingly, source select transistors included in the selected memory block are turned off. Therefore, the channels of the cell strings included in the selected memory block may float.

By means of a method of operating a semiconductor memory device according to an embodiment of the present disclosure, described with reference to FIG. 15, channel voltages of strings included in the memory block selected at the channel precharge step during the program operation may be sufficiently increased, Therefore, at the subsequent program voltage apply step, the channel potentials of the cell strings including the program-inhibited cells may be sufficiently increased. As a result, during the program operation, program disturbance of the program-inhibited cell M14 may be effectively mitigated or prevented.

Figure 16:
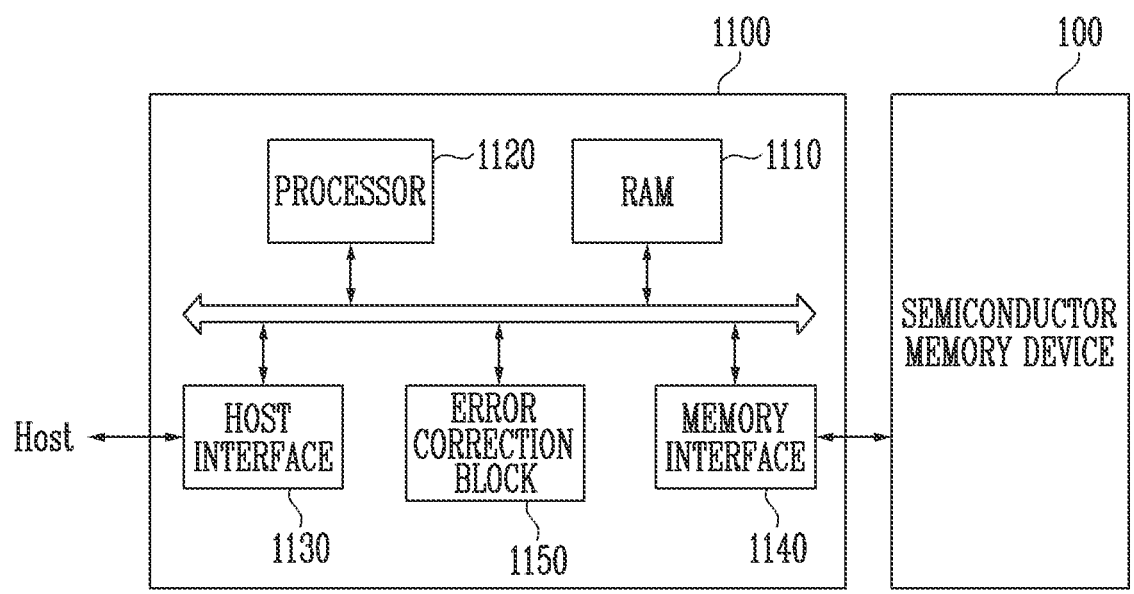
FIG. 16 is a block diagram illustrating a memory system having the semiconductor memory device of FIG, 1.

FIG. 16 is a block diagram illustrating a memory system 1000 having the semiconductor memory device 100 of FIG. 1.

Referring to FIG. 16, the memory system 1000 may include the semiconductor memory device 100 and a memory controller 1100. The semiconductor memory device 100 may be the semiconductor memory device described with reference to FIG. 1. Hereinafter, repetitive explanations will be omitted.

The memory controller 1100 is coupled to a host Host and the semiconductor memory device 100. The memory controller 1100 may access the semiconductor memory device 100 in response to a request from the host Host. For example, the memory controller 1100 may control read, write, erase, and background operations of the semiconductor memory device 100. The memory controller 1100 may provide an interface between the semiconductor memory device 100 and the host Host. The memory controller 1100 may run firmware for controlling the semiconductor memory device 100.

The memory controller 1100 includes random access memory (RAM) 1110, a processor 1120, a host interface 1130, a memory interface 1140, and an error correction block 1150. The RAM 1110 is used as at least one of working memory for the processor 1120, cache memory between the semiconductor memory device 100 and the host Host, and buffer memory between the semiconductor memory device 100 and the host. The processor 1120 may control the overall operation of the memory controller 1100. In addition, the memory controller 1100 may temporarily store program data provided from the host Host during a write operation.

The host interface 1130 includes a protocol for performing data exchange between the host Host and the memory controller 1100. In an embodiment, the memory controller 1100 may communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface may include a NAND interface or NOR interface.

The error correction block 1150 may detect and correct errors in data received from the semiconductor memory device 100 using an error correction code (ECC). In an example embodiment, the error correction block may be provided as an element of the memory controller 1100.

The memory controller 1100 and the semiconductor memory device 100 may be integrated into a single semiconductor device. In an embodiment, the memory controller 1100 and the semiconductor memory device 100 may be integrated into a single semiconductor device to form a memory card. For example, the memory controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The memory controller 1100 and the semiconductor memory device 100 may be integrated into a single semiconductor device to form a solid state drive (SSD). The SSD includes a storage device configured to store data in a semiconductor memory, When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 17:
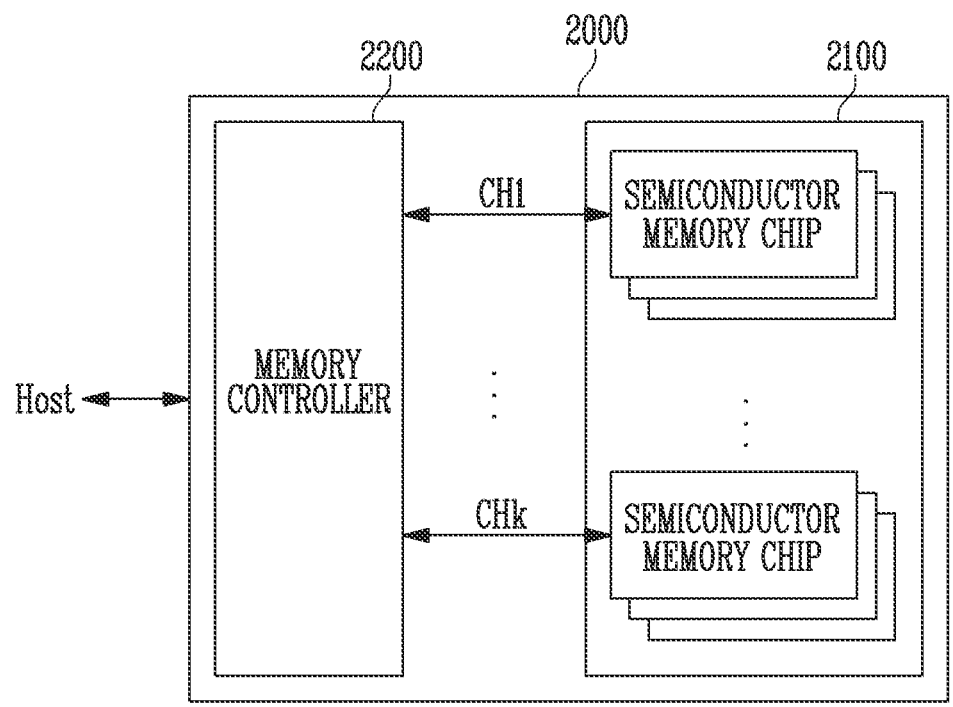
FIG. 17 is a block diagram illustrating an application of the memory system of FIG. 16.

FIG. 17 is a block diagram illustrating an example application of the memory system of FIG. 16.

Referring to FIG. 17, a memory system 2000 may include a semiconductor memory device 2100 and a memory controller 2200. The semiconductor memory device 2100 may include a plurality of semiconductor memory chips. The semiconductor memory chips are divided into a plurality of groups.

In FIG. 17, it is illustrated that a plurality of groups communicate with the memory controller 2200 through first to k-th channels CH1 to CHk. Each semiconductor memory chip may be configured and operated in the same manner as those of the semiconductor memory device 100 described with reference to FIG. 1, Each group may communicate with the memory controller 2200 through one common channel, The memory controller 2200 may have the same configuration as the memory controller 1100 described with reference to FIG, 16, and may control the plurality of memory chips of the semiconductor memory device 2100 through the plurality of channels CH1 to CHk.

Figure 18:
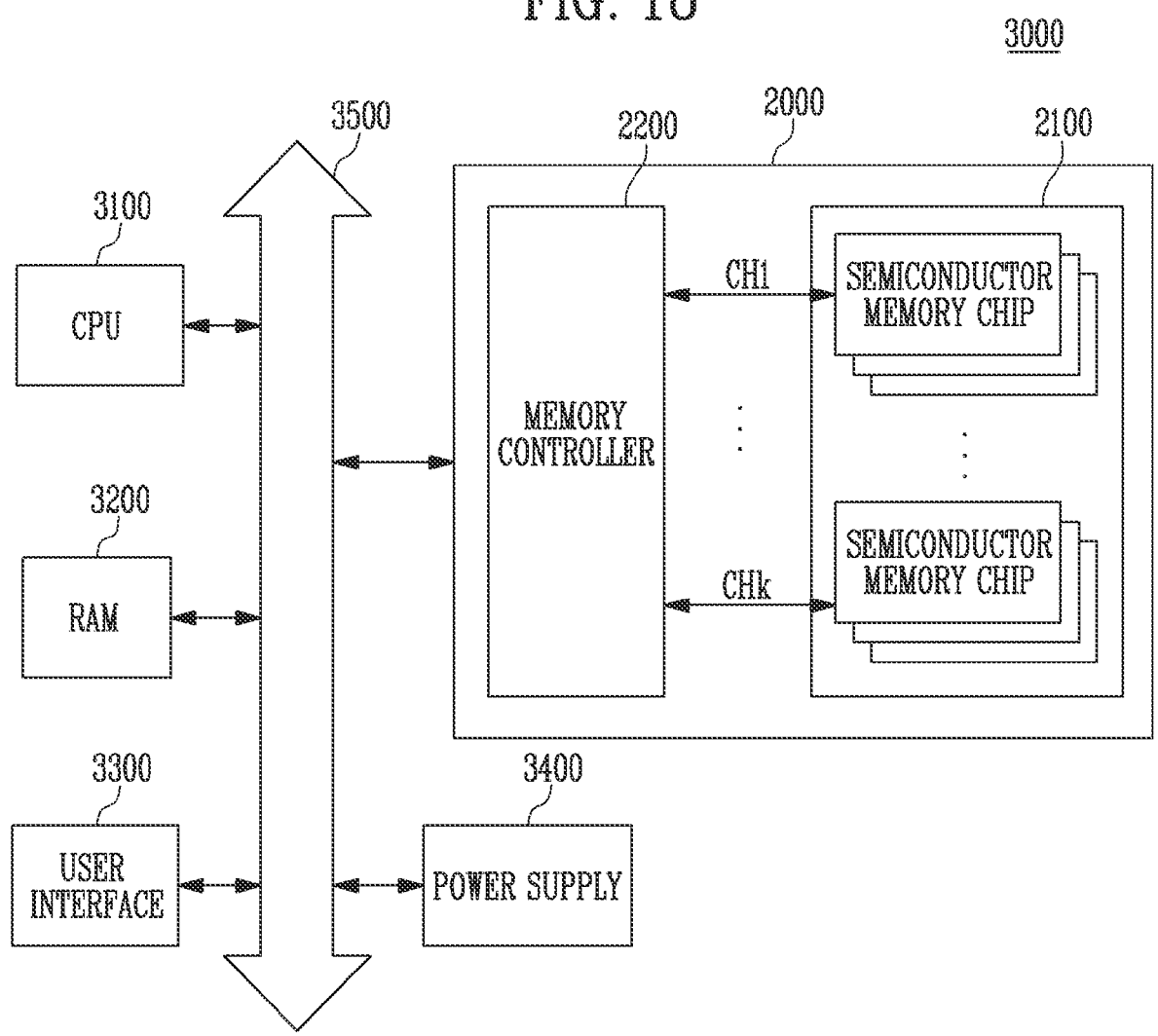
FIG. 18 is a block diagram illustrating a computing system including the memory system described with reference to FIG. 17.

FIG. 18 is a block diagram illustrating a computing system 3000 including the memory system 2000 described with reference to FIG. 17.

The computing system 3000 includes a central processing unit (CPU) 3100, RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500, Data provided through the user interface 3300 or processed by the CPU 3100 may be stored in the memory system 2000.

In FIG. 18, a semiconductor memory device 2100 is illustrated as being coupled to the system bus 3500 through the memory controller 2200. However, the semiconductor memory device 2100 may be directly coupled to the system bus 3500. Here, the function of the memory controller 2200 may be performed by the CPU 3100 and the RAM 3200.

In FIG. 18, the memory system 2000 described with reference to FIG. 17 is illustrated as being provided. However, the memory system 2000 may be replaced with the memory system 1000 described with reference to FIG. 16. In an embodiment, the computing system 3000 may include both the memory systems 1000 and 2000 described with reference to FIGS. 16 and 17, The present disclosure may provide a semiconductor memory device having enhanced program characteristics and a method of operating the semiconductor memory device.

What is claimed is:

1. A semiconductor memory device, comprising:
a memory cell array including a plurality of memory blocks coupled to a common source line;
a peripheral circuit configured to perform a program operation on a selected memory block selected from among the plurality of memory blocks included in the memory cell array; and
control logic configured to control the program operation of the peripheral circuit,
wherein the plurality of memory blocks are coupled to corresponding source select lines, respectively,
wherein the program operation comprises a plurality of program loops, each program loop including a channel precharge operation and a program pulse application operation,
wherein the control logic is configured to control, during the channel precharge operation, the peripheral circuit to:
allow the common source line to float, and
increase a voltage of a source select line coupled to an unselected memory block among the plurality of memory blocks while the common source line floats,
wherein the control logic is configured to control the peripheral circuit to perform the program pulse application operation to apply a program voltage to a selected word line among a plurality of word lines included in the selected memory block after performing the channel precharge operation.

2. The semiconductor memory device according to claim 1, wherein the control logic is configured to control, before the common source line floats, the peripheral circuit so that:
a turn-on voltage is applied to a source select line coupled to the selected memory block, and
a voltage of the common source line is increased.

3. The semiconductor memory device according to claim 1, wherein the control logic is configured to control, after the voltage of the source select line coupled to the unselected memory block has increased, the peripheral circuit so that a turn-off voltage is applied to a source select line coupled to the selected memory block.

4. The semiconductor memory device according to claim 1, wherein:
the unselected memory block is coupled to a plurality of source select lines, and
the control logic is configured to control, during the channel precharge operation, the peripheral circuit so that a voltage of a source select line disposed adjacent to the common source line, among the plurality of source select lines coupled to the unselected memory block, is increased.

5. The semiconductor memory device according to claim 4, wherein the control logic is configured to control the peripheral circuit so that, while the voltage of the source select line disposed adjacent to the common source line, among the plurality of source select lines coupled to the unselected memory block, is increased, a voltage of an additional source select line that is not disposed adjacent to the common source line, among the plurality of source select lines coupled to the unselected memory block, is maintained.

6. A semiconductor memory device, comprising:
a memory cell array including a plurality of memory blocks coupled to a common source line;
a peripheral circuit configured to perform a program operation on a selected memory block selected from among the plurality of memory blocks included in the memory cell array; and
control logic configured to control the program operation of the peripheral circuit,
wherein the plurality of memory blocks are coupled to corresponding source select lines, respectively,
wherein the operation comprises a plurality of program loops, each program loop including a channel precharge operation, a program pulse application operation, and a program verify operation,
wherein the control logic is configured to control, during the channel precharge operation, the peripheral circuit to:
apply a first voltage to the common source line,
allow the common source line to float, and
increase a voltage of the common source line by a coupling voltage by increasing a voltage of a source select line coupled to an unselected memory block among the plurality of memory blocks while the common source line floats, and
wherein the control logic is configured to control the peripheral circuit to perform the program pulse application operation to apply a program voltage to a selected word line among a plurality of word lines included in the selected memory block after performing the channel precharge operation.

7. The semiconductor memory device according to claim 6, wherein the control logic is configured to control, before the first voltage is applied to the common source line, the peripheral circuit so that:
a turn-on voltage is applied to a source select line coupled to the selected memory block, and
a ground voltage is applied to the common source line.

8. The semiconductor memory device according to claim 6, wherein the control logic is configured to control, after the voltage of the common source line has increased from the first voltage by the coupling voltage, the peripheral circuit so that a turn-off voltage is applied to a source select line coupled to the selected memory block.

9. The semiconductor memory device according to claim 6, wherein:
the unselected memory block is coupled to a first source select line that is disposed adjacent to the common source line and a second source select line that is not adjacent to the common source line, and
the control logic is configured to control, during the channel precharge operation, the peripheral circuit so that a voltage of the first source select line coupled to the unselected memory block is increased.

10. The semiconductor memory device according to claim 9, wherein the control logic is configured to control the peripheral circuit so that, while the voltage of the first source select line coupled to the unselected memory block is increased, a voltage of the second source select line coupled to the unselected memory block is maintained.

11. A method of operating a semiconductor memory device, the semiconductor memory device performing a program operation on a selected memory block selected from among a plurality of memory blocks coupled to a common source line, the method comprising:
allowing the common source line to float;
increasing, while the common source line floats, a voltage of a source select line coupled to an unselected memory block among the plurality of memory blocks; and
applying a program voltage to a selected word line among a plurality of word lines included in the selected memory block after increasing the voltage of the source select line.

12. The method according to claim 11, further comprising, before allowing the common source line to float:
applying a turn-on voltage to a source select line coupled to the selected memory block; and
increasing a voltage of the common source line.

13. The method according to claim 11, further comprising, after increasing the voltage of the source select line coupled to the unselected memory block:
applying a turn-off voltage to a source select line coupled to the selected memory block.

14. The method according to claim 11, further comprising, after increasing the voltage of the source select line coupled to the unselected memory block:
applying a pass voltage to an unselected word line, among the plurality of word lines coupled to the selected memory block.

15. The method according to claim 14, further comprising:
performing a program verify operation on memory cells coupled to the selected word line.

16. The method according to claim 11, wherein:
the unselected memory block is coupled to a plurality of source select lines, and
increasing the voltage of the source select line coupled to the unselected memory block comprises increasing a voltage of a source select line that is disposed adjacent to the common source line, among the plurality of source select lines coupled to the unselected memory block.

17. The method according to claim 16, wherein increasing the voltage of the source select line coupled to the unselected memory block further comprises:
maintaining a voltage of an additional source select line that is not disposed adjacent to the common source line among the plurality of source select lines coupled to the unselected memory block while increasing the voltage of the source select line that is disposed adjacent to the common source line.

* * * * *